United States Patent
Ikeda et al.

(10) Patent No.: US 11,139,753 B2
(45) Date of Patent: Oct. 5, 2021

(54) SEMICONDUCTOR DEVICE, POWER CONVERSION APPARATUS, AND VEHICLE

(71) Applicant: Kabushiki Kaisha Toshiba, Minato-ku (JP)

(72) Inventors: Kentaro Ikeda, Kawasaki (JP); Kazuto Takao, Tsukuba (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 1082 days.

(21) Appl. No.: 15/431,001

(22) Filed: Feb. 13, 2017

(65) Prior Publication Data

US 2017/0353128 A1 Dec. 7, 2017

(30) Foreign Application Priority Data

Jun. 6, 2016 (JP) .............................. JP2016-112793

(51) Int. Cl.
*H02M 7/5387* (2007.01)
*B60L 50/51* (2019.01)
(Continued)

(52) U.S. Cl.
CPC ......... *H02M 7/53871* (2013.01); *B60L 50/51* (2019.02); *H02M 1/08* (2013.01); *B60L 2210/10* (2013.01); *H01L 24/48* (2013.01); *H01L 24/49* (2013.01); *H01L 2224/05554* (2013.01); *H01L 2224/49171* (2013.01);
(Continued)

(58) Field of Classification Search
CPC ............... H02M 7/53871; H02M 1/08; H02M 2001/0029; H02M 2001/0054; B60L 50/51; B60L 2210/10; Y02T 10/64; Y02T 10/70; Y02T 10/72; H01L 2924/13091; H01L 2224/05554; H01L 2224/49171; H01L 24/49; H01L 2924/13055; H01L 24/48; H02P 27/06
See application file for complete search history.

(56) References Cited

U.S. PATENT DOCUMENTS 8,018,255 B2 9/2011 Hirao et al.
8,614,568 B2 12/2013 Uruno et al.
(Continued)

FOREIGN PATENT DOCUMENTS

CN 101171739 A 4/2008
JP 2000-59189 A 2/2000
(Continued)

OTHER PUBLICATIONS

Yanick Lobsiger, et al., "Closed-Loop IGBT Gate Drive Featuring Highly Dynamic di/dt and dv/dt Control", IEEE, 2012, 8 pages.

*Primary Examiner* — Daniel Cavallari
(74) *Attorney, Agent, or Firm* — Oblon, McClelland, Maier & Neustadt, L.L.P.

(57) ABSTRACT

A semiconductor device according to an embodiment includes: a first transistor having a first electrode, a second electrode, and a first control electrode, the first transistor performing a switching operation; a second transistor having a third electrode electrically connected to the second electrode, a fourth electrode, and a second control electrode, the second transistor performing an analog operation; and a third transistor having a fifth electrode electrically connected to the fourth electrode, a sixth electrode, and a third control electrode.

15 Claims, 14 Drawing Sheets

(51) Int. Cl.
  *H02M 1/08*  (2006.01)
  *H01L 23/00* (2006.01)
  *H02M 1/00*  (2006.01)
  *H02P 27/06* (2006.01)

(52) U.S. Cl.
  CPC ............... *H01L 2924/13055* (2013.01); *H01L 2924/13091* (2013.01); *H02M 1/0029* (2021.05); *H02M 1/0054* (2021.05); *H02P 27/06* (2013.01); *Y02T 10/64* (2013.01); *Y02T 10/70* (2013.01); *Y02T 10/72* (2013.01)

(56) References Cited

U.S. PATENT DOCUMENTS

| | | | |
|---|---|---|---|
| 8,878,573 B2 * | 11/2014 | Sugahara | H03K 17/168 326/83 |
| 2005/0212009 A1 * | 9/2005 | Sato | H01L 27/0262 257/107 |
| 2009/0021294 A1 | 1/2009 | Morishita et al. | |
| 2010/0008113 A1 | 1/2010 | Kuno et al. | |
| 2010/0219877 A1 | 9/2010 | Tai et al. | |
| 2017/0100998 A1 * | 4/2017 | Suzuki | B60L 50/16 |
| 2018/0191339 A1 * | 7/2018 | Cyr | H02M 1/34 |

FOREIGN PATENT DOCUMENTS

| | | |
|---|---|---|
| JP | 2001-314075 A | 11/2001 |
| JP | 2005-253183 A | 9/2005 |
| JP | 2006-353093 A | 12/2006 |
| JP | 2007-208831 A | 8/2007 |
| JP | 2008-67953 A | 3/2008 |
| JP | 4916964 | 4/2012 |
| JP | 2012-249357 | 12/2012 |
| JP | 5130310 | 1/2013 |
| JP | 2014-147237 A | 8/2014 |
| WO | WO 2008/099959 A1 | 8/2008 |
| WO | WO 2009/054143 A1 | 4/2009 |

* cited by examiner

SEMICONDUCTOR DEVICE, POWER CONVERSION APPARATUS, AND VEHICLE

CROSS-REFERENCE TO RELATED APPLICATION

This application is based upon and claims the benefit of priority from Japanese Patent Application No. 2016-112793, filed on Jun. 6, 2016, the entire contents of which are incorporated herein by reference.

FIELD

Embodiments described herein relate generally to a semiconductor device, a power conversion apparatus, and a vehicle.

BACKGROUND

Power conversion apparatuses using a semiconductor device such as MOSFET (Metal-Oxide-Semiconductor Field Effect Transistor) or IGBT (Insulated Gate Bipolar Transistor) have been actively developed.

In the power conversion apparatuses, a voltage variation such as surge may be caused when the semiconductor device is turned ON or OFF. When a large voltage variation is caused, a problem such as broken semiconductor device arises. Thus, the voltage variation is preferably to be restricted. However, restriction in voltage variation can contradict high-speed operation of the semiconductor device. That is, the high-speed operation reduces switching loss, and thus the restriction in voltage variation such as surge generally contradicts the restriction in switching loss.

DETAILED DESCRIPTION

Embodiments will be described below with reference to the drawings.

First Embodiment

A semiconductor device according to the present embodiment includes: a first transistor having a first electrode, a second electrode, and a first control electrode, the first transistor performing a switching operation; a second transistor having a third electrode electrically connected to the second electrode, a fourth electrode, and a second control electrode, the second transistor performing an analog operation; and a third transistor having a fifth electrode electrically connected to the fourth electrode, a sixth electrode, and a third control electrode.

Figure 1:
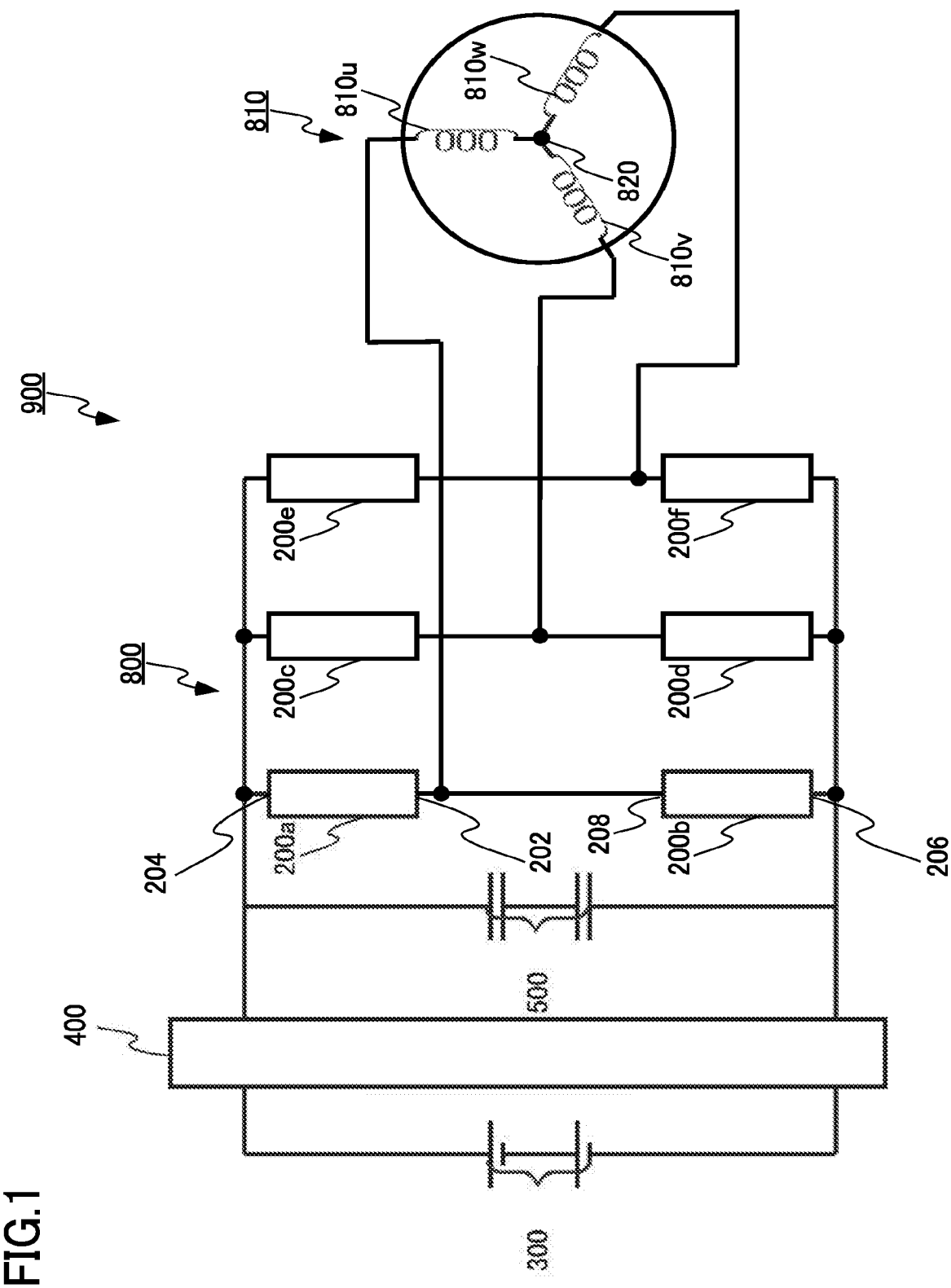
FIG. 1 is a schematic diagram of a power conversion system according to a first embodiment.

FIG. 1 is a schematic diagram of a power conversion system 900 according to the present embodiment.

The power conversion system 900 comprises a power conversion apparatus 800 and a motor 810.

The power conversion apparatus 800 comprises arms 200a, 200b, 200c, 200d, 200e, 200f, a DC power supply 300, a converter 400, and a smoothing capacitor 500.

The DC power supply 300 outputs a DC voltage. The converter 400 is a DC-DC converter for converting the DC voltage output by the DC power supply 300 into other DC voltage. The smoothing capacitor 500 smooths the voltage output by the converter 400.

The arms 200a, 200b, 200c, 200d, 200e and 200f each have a semiconductor device 100 described below. The DC voltage smoothed by the smoothing capacitor 500 is converted into an AC voltage by the arms 200a, 200b, 200c, 200d, 200e, and 200f.

For example, the arm 200a has a first arm electrode 202 and a second arm electrode 204. The arm 200b has a third arm electrode 206 and a fourth arm electrode 208. The first arm electrode 202 and the fourth arm electrode 208 are electrically connected to each other so that the arm 200a and the arm 200b are electrically connected to each other. Similarly, the arm 200c and the arm 200d, and the arm 200e and the arm 200f are electrically connected to each other, respectively.

The motor 810 has coils 810u, 810v, and 810w. One end of the coils 810u, 810w, and 810v is electrically connected to each other at a neutral point 820.

The other end of the coil 810u is electrically connected between the arm 200a and the arm 200b. The other end of the coil 810v is electrically connected between the arm 200c and the arm 200d. The other end of the coil 810w is electrically connected between the arm 200e and the arm 200f.

The ground of the power conversion apparatus 800 according to the present embodiment is electrically connected between a plurality of smoothing capacitors 500, for example. The ground of the power conversion apparatus 800 is electrically connected to an electric wire electrically connecting the arm 200b, the arm 200d, and the arm 200f to each other, for example.

Figure 2:
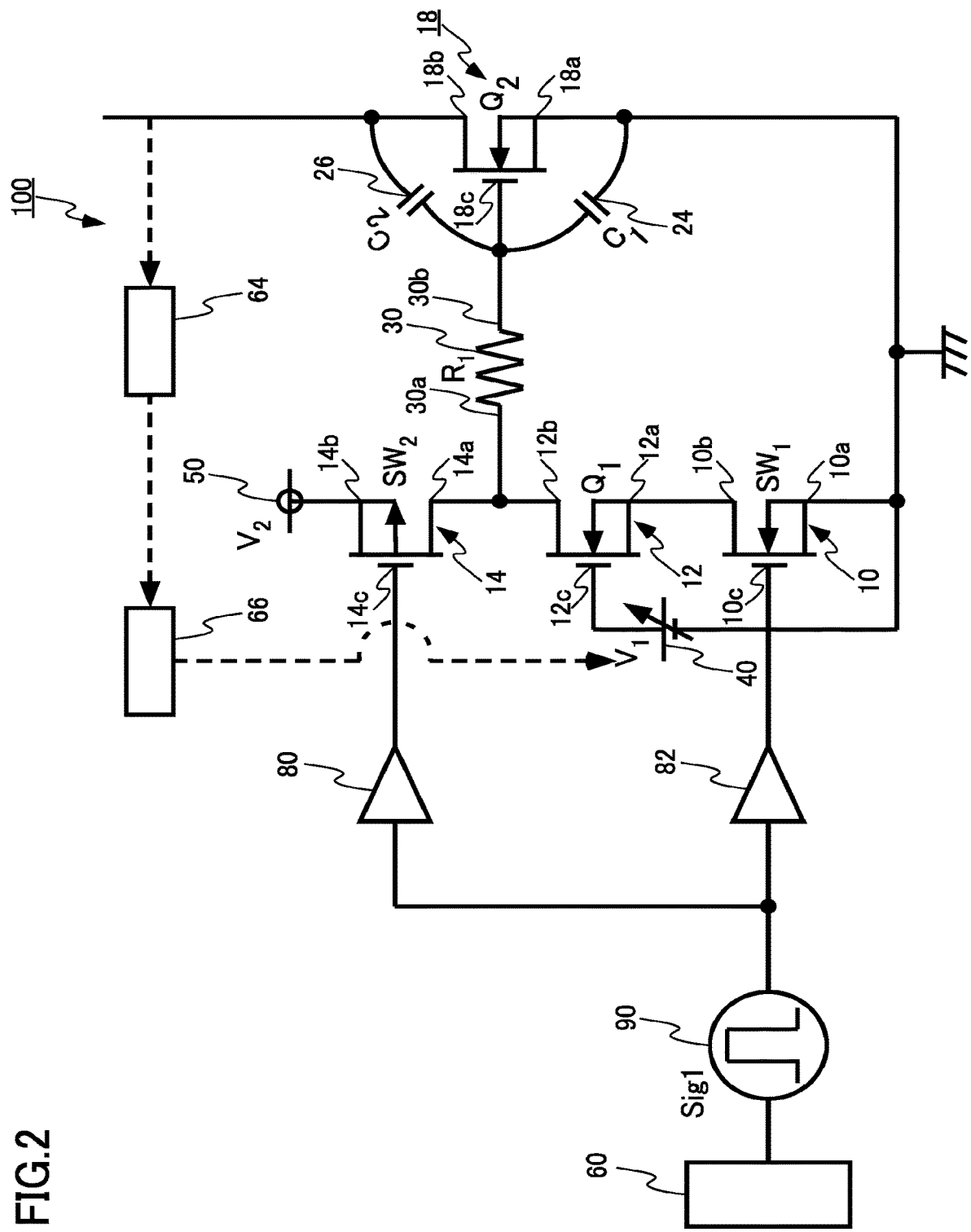
FIG. 2 is a schematic diagram of a semiconductor device according to the first embodiment.

FIG. 2 is a schematic diagram of the semiconductor device 100 according to the present embodiment.

The semiconductor device 100 includes a first transistor 10 ($SW_1$), a second transistor 12 ($Q_1$), a third transistor 14 ($SW_2$), a fifth transistor 18 ($Q_2$) a first resistor 30 ($R_1$), a variable power supply 40 ($V_1$), a voltage source 50 ($V_2$), a first controller 60, a detector 64, a third controller 66, a first buffer 80, a second buffer 82, and a first AC signal source 90 (AC signal source 90).

The first transistor 10 is an n-type MOSFET, for example. The first transistor 10 has a first electrode 10a, a second electrode 10b, and a first control electrode 10c. The first electrode 10a is an n-type MOSFET source electrode, the second electrode 10b is an n-type MOSFET drain electrode, and the first control electrode 10c is an n-type MOSFET gate electrode.

The second transistor 12 is an n-type MOSFET, for example. The second transistor 12 has a third electrode 12a, a fourth electrode 12b, and a second control electrode 12c. The third electrode 12a is an n-type MOSFET source electrode, the fourth electrode 12b is an n-type MOSFET drain electrode, and the second control electrode 12c is an n-type MOSFET gate electrode.

The third electrode 12a is electrically connected to the second electrode 10b.

The third transistor 14 is a p-type MOSFET, for example. The third transistor 14 has a fifth electrode 14a, a sixth electrode 14b, and a third control electrode 14c. The fifth electrode 14a is a p-type MOSFET drain electrode, the sixth electrode 14b is a p-type MOSFET source electrode, and the third control electrode 14c is a p-type MOSFET gate electrode.

The fifth electrode 14a is electrically connected to the fourth electrode 12b.

The fifth transistor 18 is an n-type MOSFET, for example. The fifth transistor 18 has a ninth electrode 18a, a tenth electrode 18b, and a fifth control electrode 18c. The ninth electrode 18a is an n-type MOSFET source electrode, the tenth electrode 18b is an n-type MOSFET drain electrode, and the fifth control electrode 18c is an n-type MOSFET gate electrode.

In the arm 200a of FIG. 1, the ninth electrode 18a and the tenth electrode 18b are electrically connected to the first arm electrode 202 and the second arm electrode 204, respectively. In the arm 200b, the ninth electrode 18a and the tenth electrode 18b are electrically connected to the third arm electrode 206 and the fourth arm electrode 208, respectively.

Thus, the tenth electrode 18b of the semiconductor device 100 (one semiconductor device 100) in the arm 200b is electrically connected to the ninth electrode 18a of the semiconductor device 100 (the other semiconductor device 100) in the arm 200a.

The fifth transistor 18 has a first parasitic capacity 24 and a second parasitic capacity 26.

The first transistor 10 may employ IGBT, JFET (Junction FET) or BJT (Bipolar Junction Transistor), for example, in addition to MOSFET.

The second transistor 12 may employ IGBT or JFET, for example, in addition to MOSFET.

The third transistor 14 may employ IGBT or JFET, for example, in addition to MOSFET.

The fifth transistor 18 may employ IGBT or JFET, for example, in addition to MOSFET.

The first resistor 30 is a gate series resistor. The first resistor 30 has a first resistance electrode 30a and a second resistance electrode 30b.

The first resistance electrode 30a is electrically connected to the fourth electrode 12b and the fifth electrode 14a. The second resistance electrode 30b is electrically connected to the fifth control electrode 18c. Thereby, the fifth control electrode 18c is electrically connected to the fourth electrode 12b and the fifth electrode 14a via the first resistor 30.

The first resistor 30 does not necessarily need to be provided. In other words, a resistance value of the first resistor 30 may be 0Ω.

The variable power supply 40 is a variable voltage source or variable current source, for example. The variable power supply 40 has a voltage source, and a variable resistor electrically connected to the voltage source, for example. Alternatively, the variable power supply 40 has a current source, and a variable resistor electrically connected to the current source, for example. The variable power supply 40 is electrically connected to the second control electrode 12c.

The variable power supply 40 inputs a variable gate voltage into the second control electrode 12c.

The gate voltage is controlled to be around a threshold voltage of the second transistor 12 so that the second transistor 12 operates as variable resistor. Thus, the second transistor 12 can perform an analog operation.

The variable power supply 40 is controlled such that the gate voltage of the second transistor 12 (the voltage of the second control electrode 12c) is a high-level voltage or less of the gate voltage of the first transistor 10 (the voltage of the first control electrode 10c).

Thereby, the gate voltage of the second transistor 12 can be controlled to be around the threshold voltage of the second transistor 12. Therefore, the second transistor 12 can perform the analog operation.

A device used for controlling the gate voltage of the second transistor 12 is not limited to the variable power supply 40. The variable power supply 40 can employ any device capable of inputting a variable gate voltage into the second control electrode 12c.

The detector 64 is a voltmeter or ammeter, for example. The detector 64 measures a current flowing between the ninth electrode 18a and the tenth electrode 18b or a voltage between the ninth electrode 18a and the tenth electrode 18b. In other words, the detector 64 measures a source/drain current or source/drain voltage of the fifth transistor 18.

The third controller 66 controls a voltage output by the variable power supply 40 on the basis of the current or voltage measured by the detector 64. For example, if the variable power supply 40 includes the above variable resistor, the third controller 66 is a microcomputer, a PC (Personal Computer), a FPGA (Field-Programmable Gate Array), a circuit board, or a combination thereof for varying the resistance value of the variable resistor.

Thereby, the voltage of the second control electrode 12c is determined on the basis of a current flowing between the ninth electrode 18a and the tenth electrode 18b or a voltage between the ninth electrode 18a and the tenth electrode 18b.

The third controller 66 can control the voltage output by the variable power supply 40 on the basis of information on other voltage or current.

The voltage source 50 is electrically connected to the sixth electrode 14b. The voltage source 50 applies a voltage $V_2$ to the sixth electrode 14b.

The first AC signal source 90 is electrically connected to the first control electrode 10c via the second buffer 82. The first AC signal source 90 inputs a signal for causing the first transistor 10 to perform a switching operation, such as rectangular wave signal, into the first control electrode 10c.

The first AC signal source 90 is electrically connected to the third control electrode 14c via the first buffer 80. The first AC signal source 90 inputs a signal for causing the third transistor 14 to perform a switching operation, such as rectangular wave signal, into the third control electrode 14c.

The first transistor 10 and the third transistor 14 perform the switching operation in response to the signal from the first AC signal source 90.

The first buffer 80 and the second buffer 82 output the logic of the signal input by the first AC signal source 90. The first transistor 10 and the third transistor 14 exclusively operate. The first buffer 80 may have a level shift function in order to cause the first transistor 10 and the third transistor 14 to exclusively perform accurately. A configuration for causing the first transistor 10 and the third transistor 14 to exclusively operate is not limited to the above configuration.

The first controller 60 is electrically connected to the first AC signal source 90. The first controller 60 controls a signal for turning ON/OFF the first transistor 10 and the third transistor 14, which is generated by the first AC signal source 90.

The first controller 60 is a microcomputer, a PC (Personal Computer), a FPGA (Field-Programmable Gate Array), a circuit board or a combination thereof, for example. Thereby, the first AC signal source 90 can receive a signal generated by the microcomputer or FPGA.

The functions and effects of the present embodiment will be described below.

The semiconductor device 100 according to the present embodiment employs an active gate control technique for restricting a voltage variation caused when the power semiconductor performs the switching operation. The active gate control technique dynamically controls a gate voltage of the power transistor. The active gate control technique is applied so that a peak voltage is restricted when the power transistor performs the switching operation, thereby preventing the semiconductor device or the power conversion apparatus from being broken.

For example, consider that the gate voltage of the fifth transistor 18 is dynamically controlled in the semiconductor device 100 of FIG. 2. A device capable of dynamically controlling the gate voltage is electrically connected to the fifth control electrode 18c in order to dynamically control the gate voltage.

For example, consider that an operational amplifier is electrically connected to the fifth control electrode 18c thereby to control the gate voltage. In this case, a slew rate of the operational amplifier restricts the control speed of the fifth transistor 18. Thus, it is difficult to dynamically control the gate voltage at a high speed.

For example, consider that the first transistor 10 performing the switching operation and the third transistor 14 performing the switching operation are electrically connected to the fifth control electrode 18c. In this case, the gate voltage can be changed at a higher speed. However, both the first transistor 10 and the third transistor 14 operate as switch, and thus it is difficult to control the gate voltage with accuracy.

According to the present embodiment, the second transistor 12 is provided between the first transistor 10 and the third transistor 14. The first transistor 10 performs the switching operation and the second transistor 12 performs the analog operation. With the configuration, the second transistor 12 can control discharging of the charges present in the gate electrode of the fifth transistor 18. Thus, the peak voltage is restricted during the switching operation, and the gate voltage can be dynamically controlled even during the high-speed operation. Therefore, both high-speed operation and restriction in voltage variation can be achieved.

Figure 3:
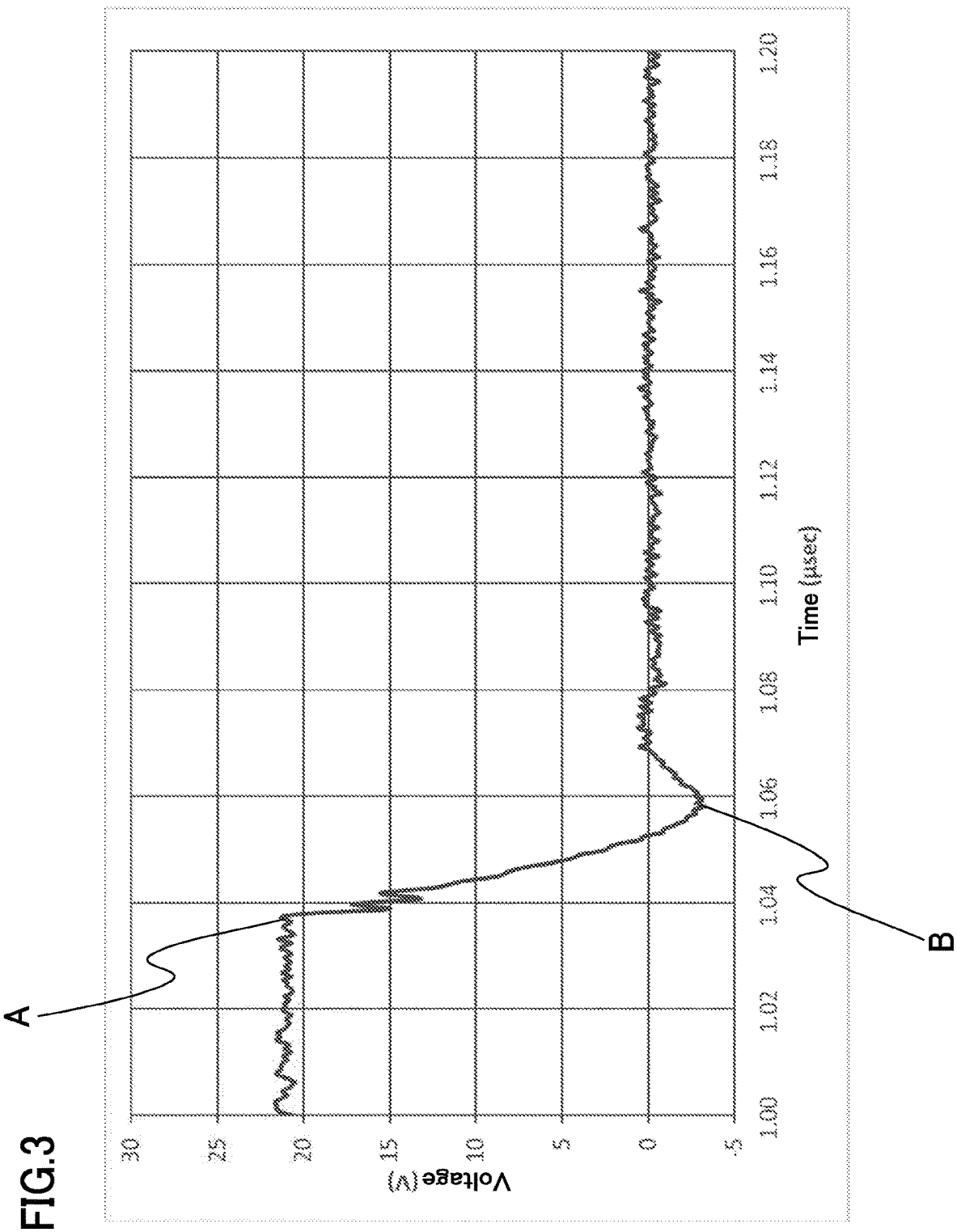
FIG. 3 is an explanatory diagram of function and effect of the semiconductor device according to the first embodiment.

FIG. 3 is an explanatory diagram of function and effect of the semiconductor device 100 according to the present embodiment. FIG. 3 illustrate fall of the drain/source voltage of the fifth transistor 18.

The fall of the drain/source voltage changes from 21 V to 0 V in about 15 nsec between 1.04 μsec at point A and 1.055 μsec at point B in FIG. 3 according to the data at the highest speed. The remarkable high-speed switching operation is realized by the semiconductor device 100 according to the present embodiment.

As described above, with the semiconductor device according to the present embodiment, it is possible to provide a semiconductor device capable of achieving both high-speed operation and restriction in voltage variation.

Second Embodiment

A semiconductor device according to the present embodiment is different from the first embodiment in that the fourth electrode 12b is electrically connected to the first electrode 10a and the second electrode 10b is electrically connected to the fifth electrode 14a. The same parts as in the first embodiment will not be described below.

Figure 4:
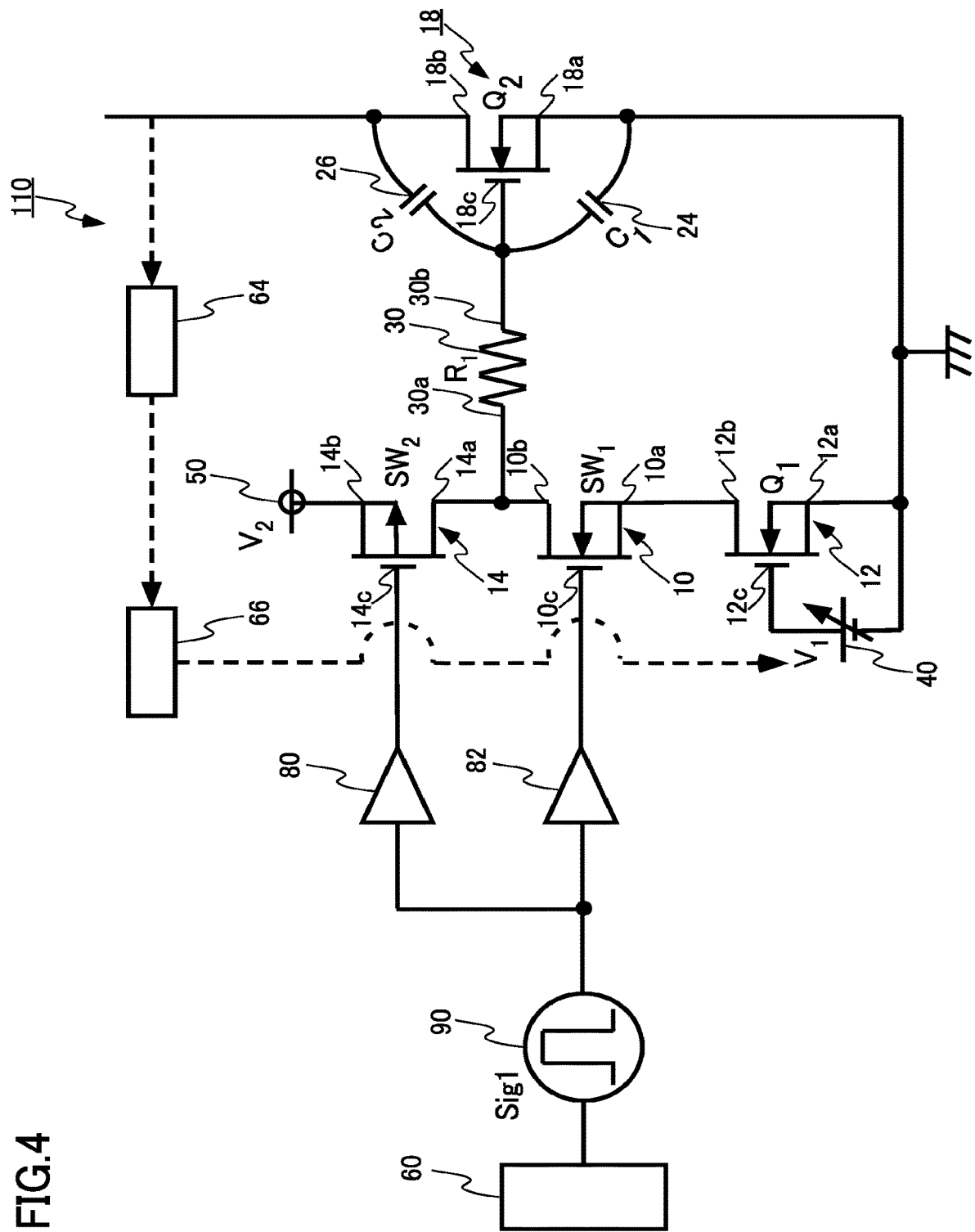
FIG. 4 is a schematic diagram of a semiconductor device according to a second embodiment.

FIG. 4 is a schematic diagram of a semiconductor device 110 according to the present embodiment.

In the semiconductor device 110 according to the present embodiment, the first transistor 10 performing the switching operation is electrically connected to the fifth transistor 18 via the first resistor 30. The second transistor 12 performing the analog operation is electrically connected to the fifth transistor 18 via the first transistor 10.

The semiconductor device 110 according to the present embodiment is different from the first embodiment in that the first transistor 10 is not connected between the variable power supply 40 and the second transistor 12. Thus, a stable voltage can be applied to the second control electrode 12c. Therefore, the second transistor 12 can be stably operated.

As described above, with the semiconductor device 110 according to the present embodiment, similarly to the semiconductor device 100 according to the first embodiment, the peak voltage during the switching operation can be restricted and the gate voltage can be dynamically controlled even during the high-speed operation. Therefore, it is possible to provide a semiconductor device capable of achieving both high-speed operation and restriction in voltage variation.

With the semiconductor device 110 according to the present embodiment, the transistor performing the analog operation is more stably driven thereby to provide a semiconductor device capable of achieving both higher-speed operation and restriction in voltage variation.

Third Embodiment

A semiconductor device according to the present embodiment is different from the first embodiment in that it further includes a capacitor electrically connected between the second control electrode 12c and the first electrode 10a. The same parts as in the first and second embodiments will not be described below.

Figure 5:
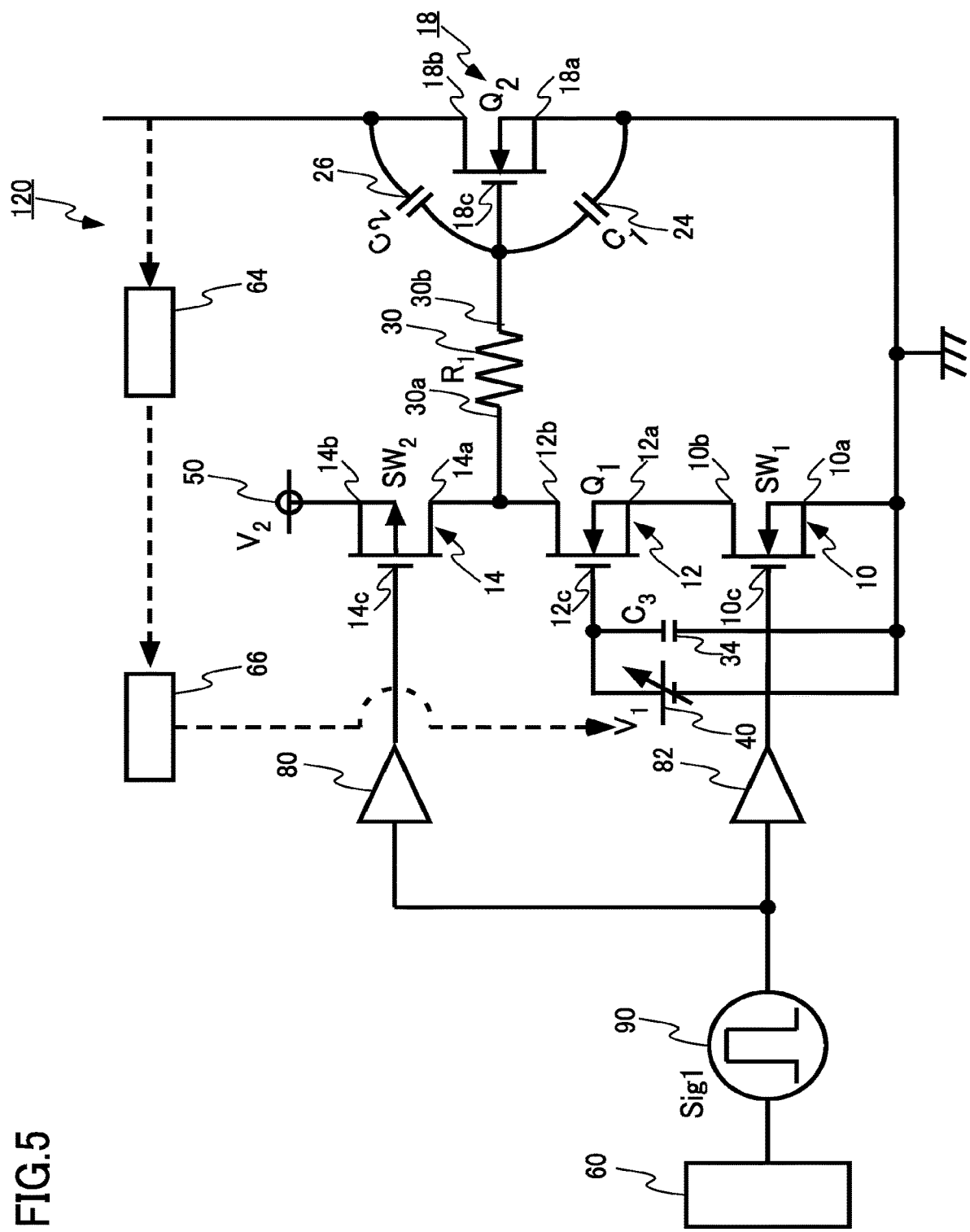
FIG. 5 is a schematic diagram of a semiconductor device according to a third embodiment.

FIG. 5 is a schematic diagram of a semiconductor device 120 according to the present embodiment.

With the semiconductor device 110 according to the second embodiment, the voltage of the first electrode 10a changes depending on the voltage between the third electrode 12a and the fourth electrode 12b. Thus, there is a problem that the first transistor 10 unstably operates.

The first transistor 10 can stably operate with the semiconductor device 100 according to the first embodiment contrary to the semiconductor device 110 according to the second embodiment. However, the voltage of the third electrode 12a changes depending on the voltage between the first electrode 10a and the second electrode 10b. Therefore, there is a problem that the second transistor 12 unstably operates.

A capacitor 34 is provided in the semiconductor device 120 according to the present embodiment thereby to stabilize the gate potential of the second transistor 12. Thereby, it is possible to keep a pulse width while the fifth transistor 18 is performing the switching operation.

Figure 6A:
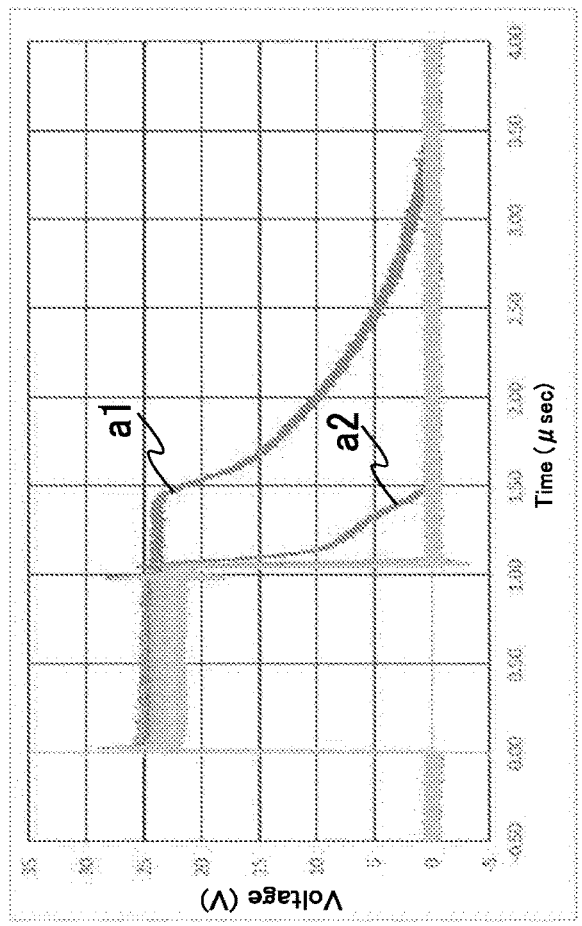
FIGS. 6A and 6B are explanatory diagrams of functions and effects of the semiconductor device according to the third embodiment.
Figure 6B:
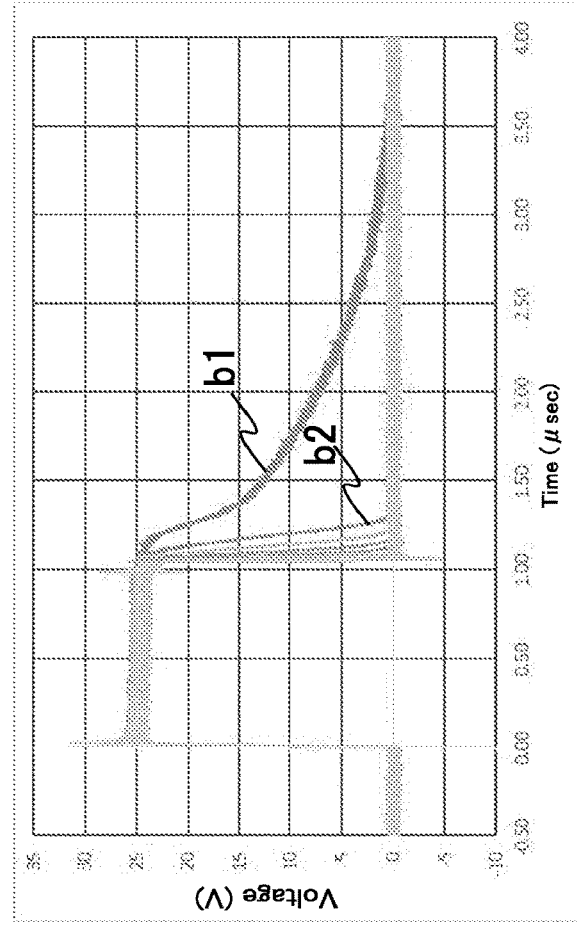

FIGS. 6A and 6B are diagrams for explaining the functions and effects of the semiconductor device according to the present embodiment. FIG. 6A illustrates a change in drain/source voltage of the fifth transistor 18 when the capacitor 34 is not provided, and FIG. 6B illustrates a change in drain/source voltage of the fifth transistor 18 when the capacitor 34 is provided.

Herein, "a1" in FIG. 6A and "b1" in FIG. 6B are a change in drain/source voltage under the change condition of the voltage $V_1$ of the same variable power supply 40. On the other hand, "a2" in FIG. 6A and "b2" in FIG. 6B increase the voltage $V_1$ of the variable power supply 40 at a higher speed and more rapidly decrease the gate resistance of the second transistor 12 than "a1" in FIG. 6A and "b1" in FIG. 6B. Thereby, the charges present in the gate electrode of the fifth transistor 18 are more rapidly discharged.

The drain/source voltage is kept to be high until around 1.4 psec in the data indicated by "a1" in FIG. 6A. On the other hand, the voltage starts steeply decreasing around 1.2 psec in the data indicated by "b1" in FIG. 6B.

The drain/source voltage is 0 V around 1.5 μsec in the data indicated by "a2" in FIG. 6A. On the other hand, the drain/source voltage is 0 V around 1.3 μsec in the data indicated by "b2" in FIG. 6B.

The results of FIGS. 6A and 6B indicate that the capacitor 34 is provided so that the drain/source voltage of the fifth transistor 18 is more rapidly stabilized, thereby keeping the pulse width while the fifth transistor 18 is performing the switching operation.

The fact that the pulse width can be kept as in "b1" in FIG. 6B and "b2" in FIG. 6B even under the control condition of the variable power supply 40 in any of "a1" in FIG. 6A and "a2" in FIG. 6A indicates that the effect of the capacitor 34 does not depend on the control condition of the variable power supply 40.

With the semiconductor device 120 according to the present embodiment, the peak voltage can be restricted during the switching operation and the gate voltage can be dynamically controlled even during the high-speed operation similarly to the semiconductor device 100 according to the first embodiment. Thus, it is possible to provide a semiconductor device capable of achieving both high-speed operation and restriction in voltage variation.

Further, with the semiconductor device 120 according to the present embodiment, the transistor performing the analog operation and the transistor performing the switching operation are stably driven thereby to provide a semiconductor device capable of achieving both higher-speed operation and restriction in voltage variation.

Fourth Embodiment

A semiconductor device according to the present embodiment is different from the first to third embodiments in that it further includes a fourth transistor 16 having a seventh electrode 16a electrically connected to the first electrode 10a, an eighth electrode 16b electrically connected to the fifth electrode 14a, and a fourth control electrode 16c. The same parts as in the first to third embodiments will not be described below.

Figure 7:
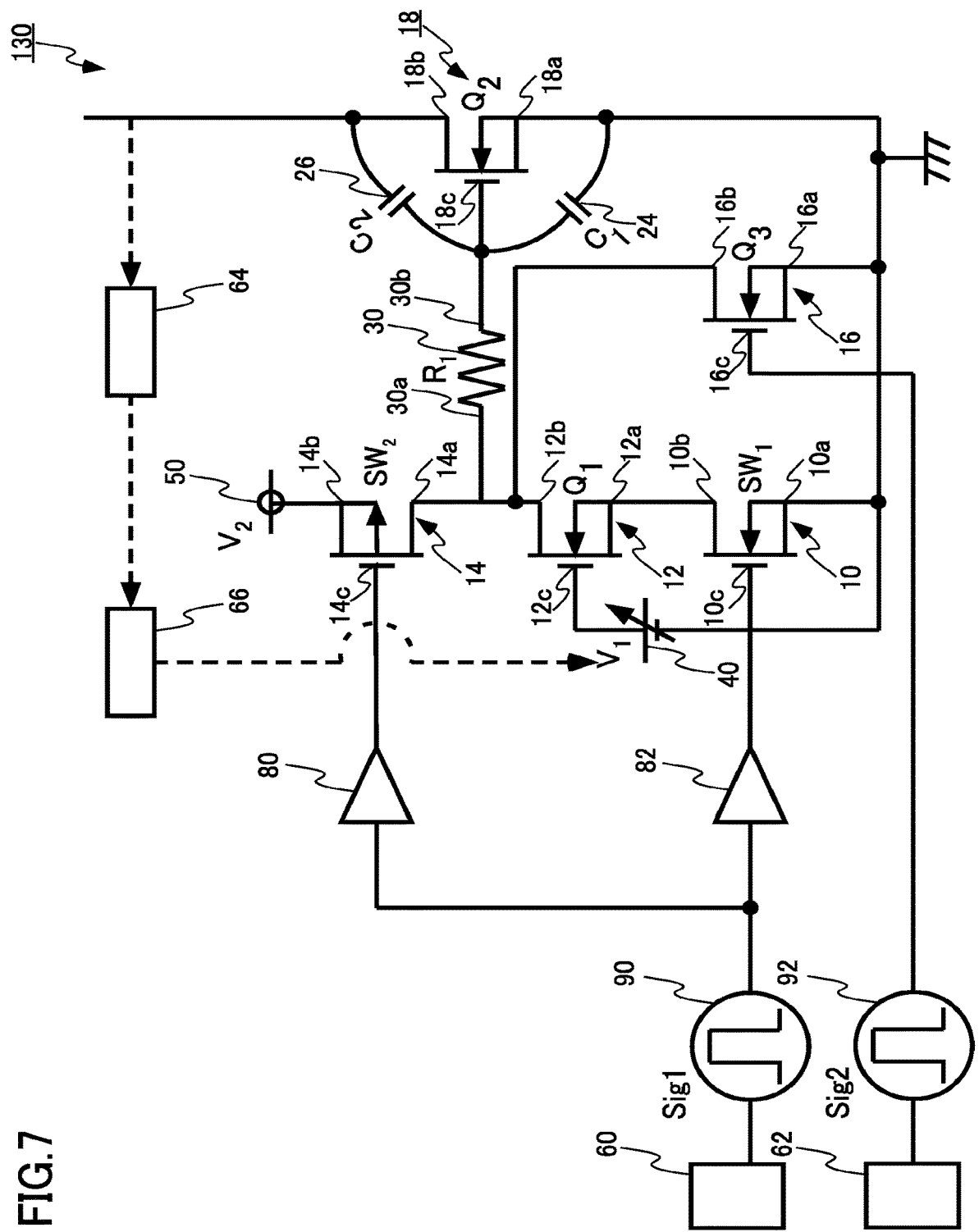
FIG. 7 is a schematic diagram of a semiconductor device according to a fourth embodiment.

FIG. 7 is a schematic diagram of a semiconductor device 130 according to the present embodiment.

The fourth transistor 16 is an n-type MOSFET, for example. Alternatively, the fourth transistor 16 is IGBT, JFET, or BJT, for example.

A second AC signal source 92 is electrically connected to the fourth control electrode 16c. The second AC signal source 92 inputs a signal for operating the fourth transistor 16 into the fourth control electrode 16c.

A second controller 62 (controller 62) is electrically connected to the second AC signal source 92. The second controller 62 controls a signal generated by the second AC signal source 92.

The second controller 62 is a microcomputer, a PC (Personal Computer), a FPGA (Field-Programmable Gate Array), a circuit board or a combination thereof, for example. Thereby, the second AC signal source 92 can receive a signal generated by the microcomputer or FPGA.

Figure 8:
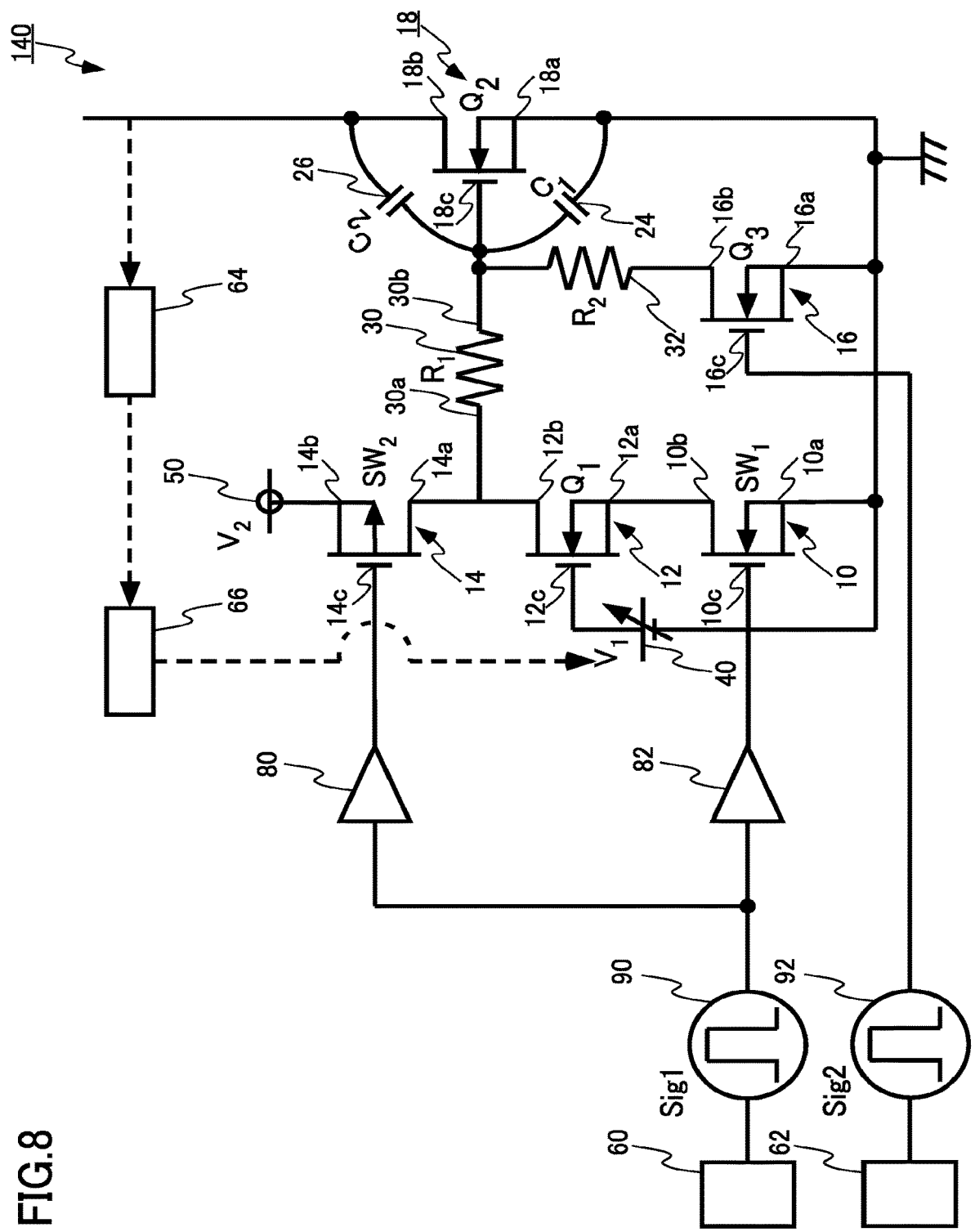
FIG. 8 is a schematic diagram of a semiconductor device according to other form of the fourth embodiment.

FIG. 8 is a schematic diagram of a semiconductor device 140 according to the present embodiment.

The fourth transistor 16 may be electrically connected between the first resistor 30 and the fifth control electrode 18c via a second resistor 32 at one end electrically connected therebetween.

The second resistor 32 may not be provided.

The functions and effects of the present embodiment will be described below.

The gate voltage of the fifth transistor 18 is set to be much higher than the threshold voltage in order to drive the fifth transistor 18 sufficiently.

In this case, when the fifth transistor 18 is to be turned OFF at a predetermined timing, the fifth transistor 18 may not be turned OFF at the predetermined timing and may be turned OFF at a predetermined temporal difference.

In particular, the predetermined temporal difference is larger when the fifth transistor 18 is discharged over time. Therefore, the way to set a dead time when a power conversion transistor is incorporated in an inverter or the like is complicated.

The semiconductor device 140 according to the present embodiment is accordingly provided with the fourth transistor 16. When the fifth transistor 18 is turned OFF, the fourth transistor 16 is turned ON. Thereby, the charges of the fourth control electrode 16c can be more rapidly discharged than when the first transistor 10 and the second transistor 12 are used.

The fourth transistor 16 is turned OFF as needed, thereby controlling the predetermined temporal difference.

Figure 9:
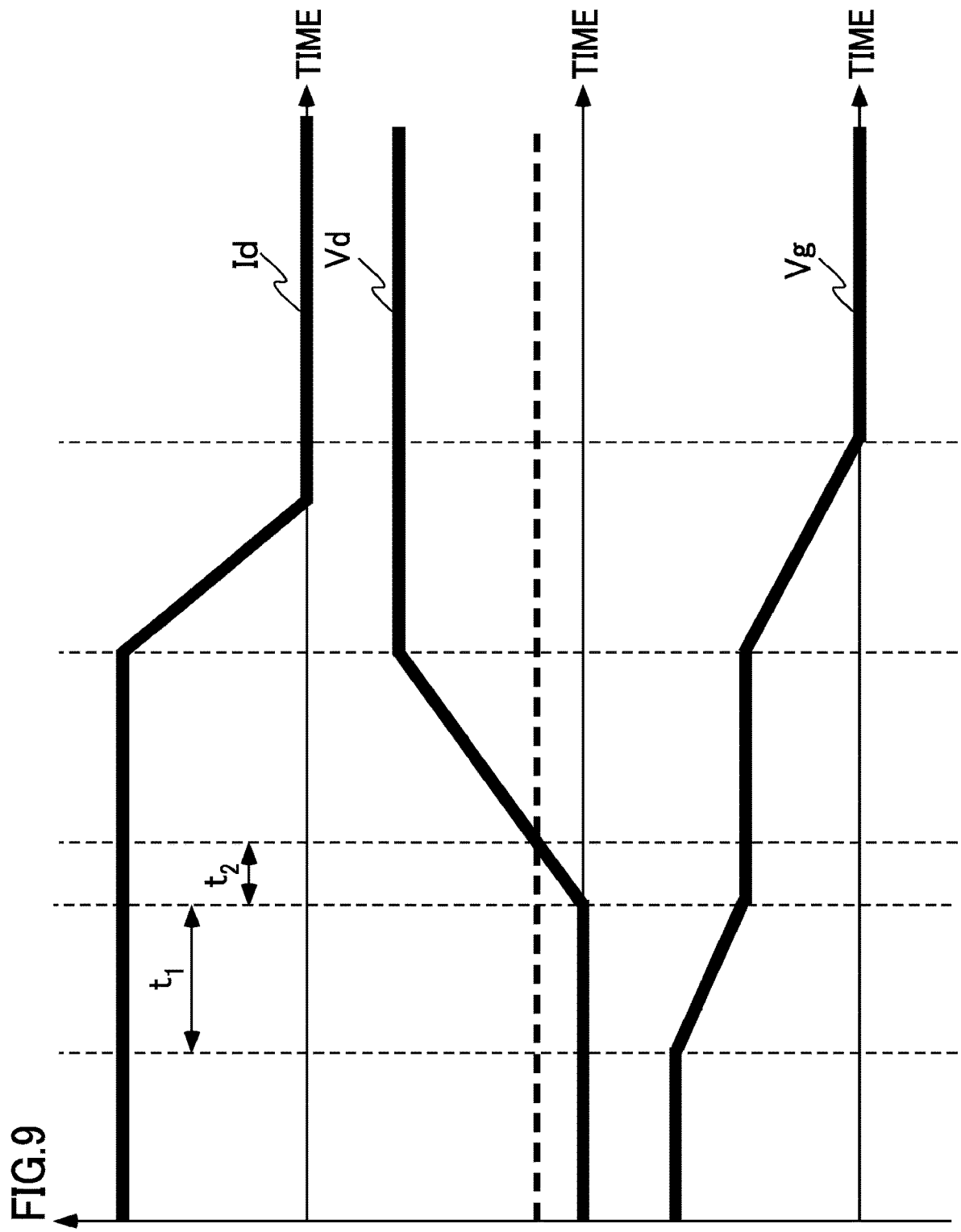
FIG. 9 is a schematic diagram of a method for controlling the semiconductor device according to the fourth embodiment.

FIG. 9 is a schematic diagram illustrating a method for controlling the semiconductor device 130 according to the present embodiment. Id, Vd, and Vg are a drain current, a drain voltage, and a gate voltage of the fourth transistor 16, respectively.

Exemplary control of the semiconductor device 130 according to the present embodiment is that the second controller 62 turns ON the fourth transistor 16 within a first predetermined time $t_1$ after the voltage of the fifth control electrode 18c starts decreasing.

Herein, $t_1$ can be determined on the basis of a time constant calculated by the resistance of the first resistor 30, the ON-resistance of the fourth transistor 16, the ON-resistance of the second transistor 12, the ON-resistance of the third transistor 14, the first parasitic capacity 24, and the second parasitic capacity 26. The voltage of the fifth control electrode 18c is a difference in potential between the fifth control electrode 18c and the ninth electrode 18a, for example.

After the voltage of the fifth control electrode 18c starts decreasing, the drain voltage of the fifth transistor 18 (the voltage of the tenth electrode 18b) starts increasing. Other exemplary control of the semiconductor device 130 according to the present embodiment is that the second controller 62 turns ON the fourth transistor 16 within a second predetermined time $t_2$ after the drain voltage of the fifth transistor 18 starts increasing.

In particular, when the load electrically connected to the power conversion system 900 is an inductive load such as inductor or motor, when Vg decreases and the first predetermined time $t_1$ elapses, a time period in which Vg does not change over time is caused.

Vd starts increasing in the time period. Thus, a predetermined threshold voltage is provided for Vd thereby to turn ON the fourth transistor 16 until Vd exceeds the predetermined threshold voltage. The voltage of the tenth electrode 18b is a difference in potential between the tenth electrode 18b and the ninth electrode 18a, for example.

Other exemplary control of the semiconductor device 130 according to the present embodiment is that the second controller 62 turns ON the fourth transistor 16 when the voltage of the fifth control electrode 18c is at zero.

Consider that the arm 200a and the arm 200b have the semiconductor device 130. Then consider that the fifth transistor 18 in the arm 200a is ON while the fifth transistor 18 in the arm 200b is OFF.

At this time, the charges may enter the fifth control electrode 18c in the arm 200b via the second parasitic capacity 26 of the arm 200b and the fifth transistor 18 in the arm 200b may be turned ON. The phenomenon is called erroneous ignition.

The fourth transistor 16 is turned ON so that the charges entering the fifth control electrode 18c in the arm 200b via the second parasitic capacity 26 can be removed via the fourth transistor 16. Thus, the erroneous ignition can be prevented.

The peak voltage can be restricted during the switching operation and the gate voltage can be dynamically controlled even during the high-speed operation in the semiconductor device 130 according to the present embodiment similarly to the semiconductor device 100 according to the first embodiment. Thus, it is possible to provide a semiconductor device capable of achieving both high-speed operation and restriction in voltage variation.

The semiconductor device 130 according to the present embodiment is provided with the fourth transistor 16 thereby to accurately control the gate voltage of the fifth transistor 18. Thus, it is possible to provide a semiconductor device capable of achieving both higher-speed operation and restriction in voltage variation.

Fifth Embodiment

A package according to the present embodiment is different from the first to fourth embodiments in that a semiconductor device according to the first to fourth embodiments is mounted on a single package to be an IC (Integrated Circuit) of the single package. The same parts as in the first to fourth embodiments will not be described below.

Figure 10:
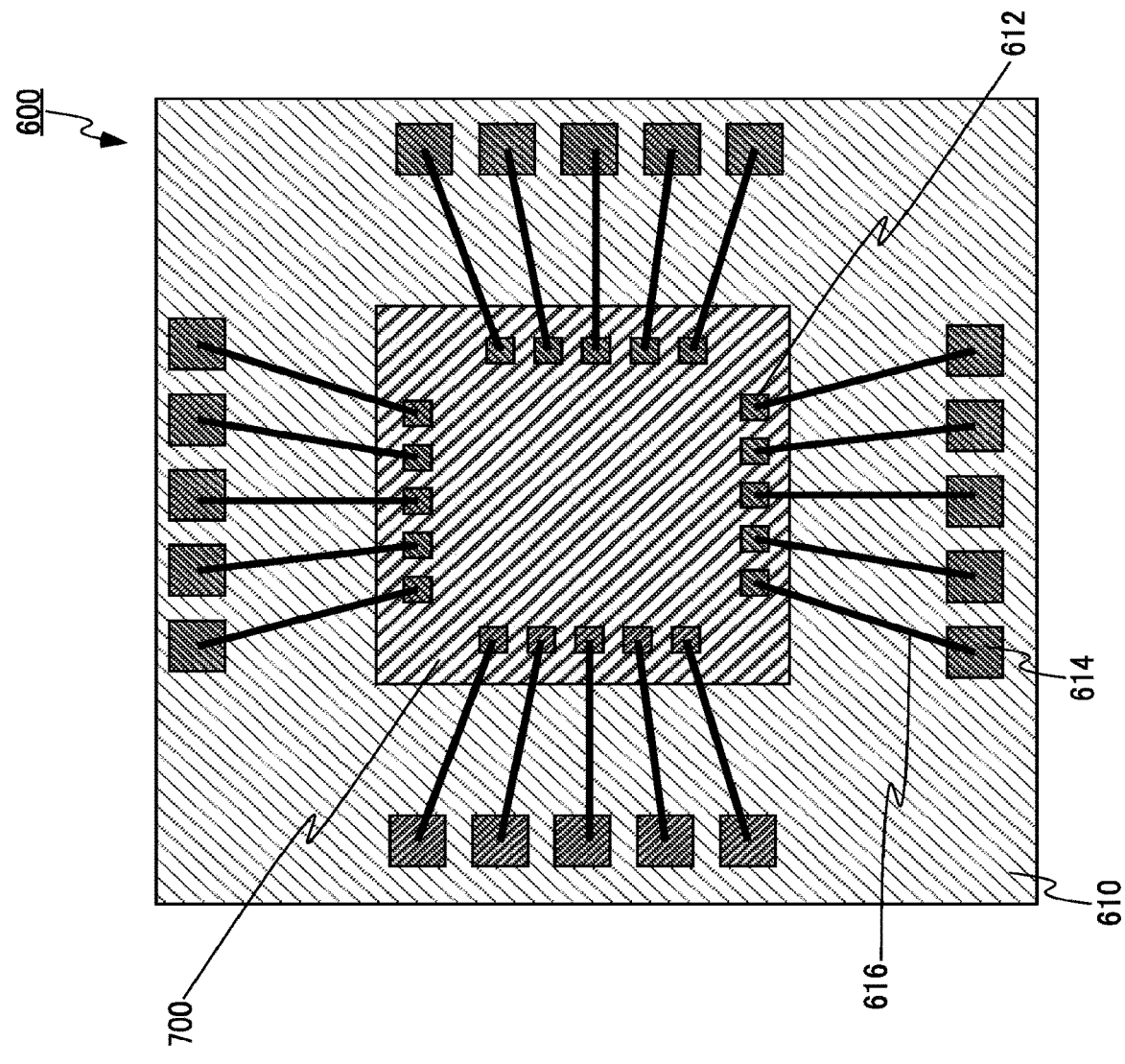
FIG. 10 is a schematic diagram of a package according to a fifth embodiment.

FIG. 10 is a schematic diagram of a package 600 according to the present embodiment.

A semiconductor device according to the first to fourth embodiments is mounted on a die 700 by use of an IC process suitable for an electric circuit of the semiconductor device. The die 700 is provided on a package substrate 610 to be mounted on a single package for IC.

The die 700 and the package substrate 610 are provided with bonding pads 614 and bonding pads 612, respectively. The bonding pads 614 and the bonding pads 612 are electrically connected to each other via connecting wires 616.

The fifth transistor 18 may or may not be incorporated in the die 700.

With the package according to the present embodiment, a package in which the semiconductor devices capable of achieving both high-speed operation and restriction in voltage variation are mounted on a single package is provided.

Sixth Embodiment

An inverter circuit and a drive apparatus according to the present embodiment includes a semiconductor device according to the first to fourth embodiments.

Figure 11:
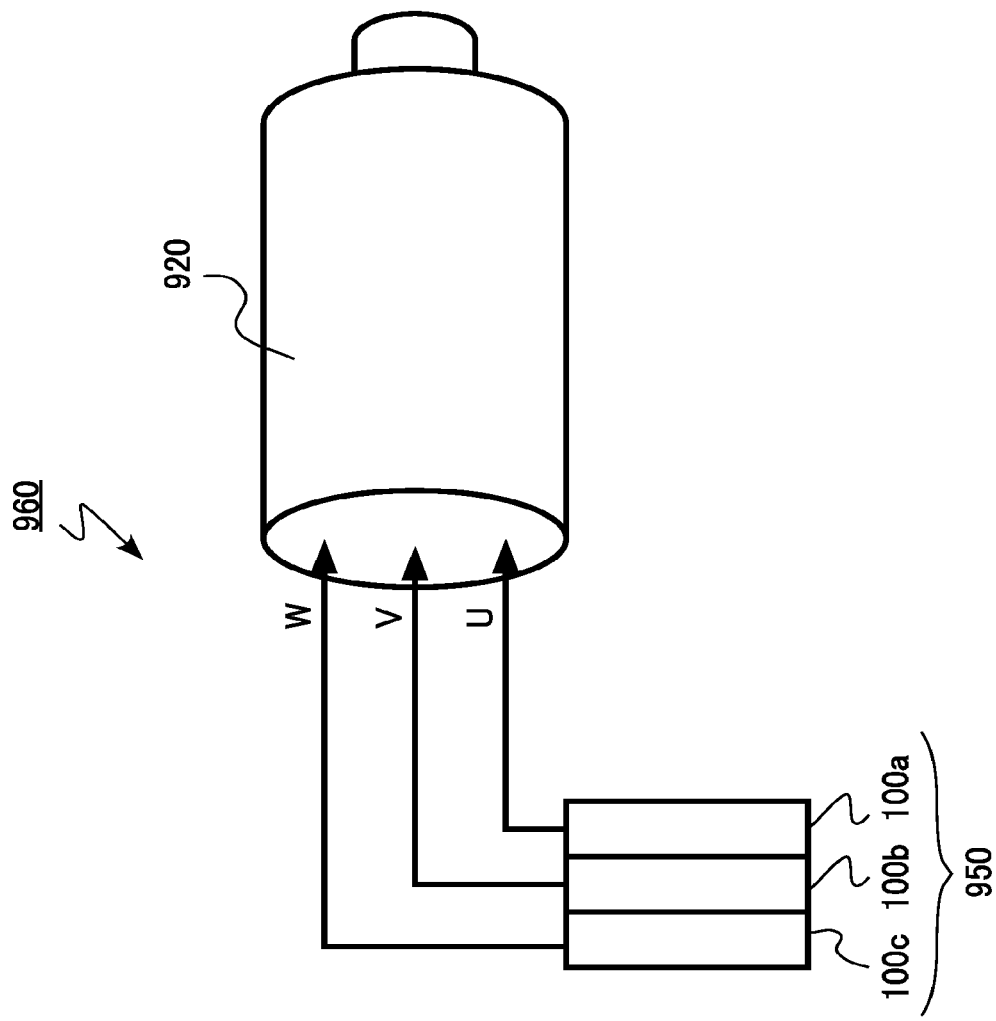
FIG. 11 is a schematic diagram of a drive apparatus according to a sixth embodiment.

FIG. 11 is a schematic diagram of a drive apparatus according to the present embodiment. A drive apparatus 960 includes a motor 920 and an inverter circuit 950. The inverter circuit 950 corresponds to the power conversion system 900.

The inverter circuit 950 is configured of three semiconductor modules 100a, 100b, and 100c in which a semiconductor device according to the first to fourth embodiments is a switching device. The three semiconductor modules 100a, 100b, and 100c are connected in parallel thereby to realize a three-phase inverter circuit 150 including three AC voltage output terminals U, V, and W. The motor 920 is driven by an AC voltage output from the inverter circuit 150.

According to the present embodiment, there is provided the drive apparatus 960 including a semiconductor device capable of achieving both high-speed operation and restriction in voltage variation.

Seventh Embodiment

A vehicle according to the present embodiment is a railroad vehicle including a semiconductor device according to the first to fourth embodiments.

Figure 12:
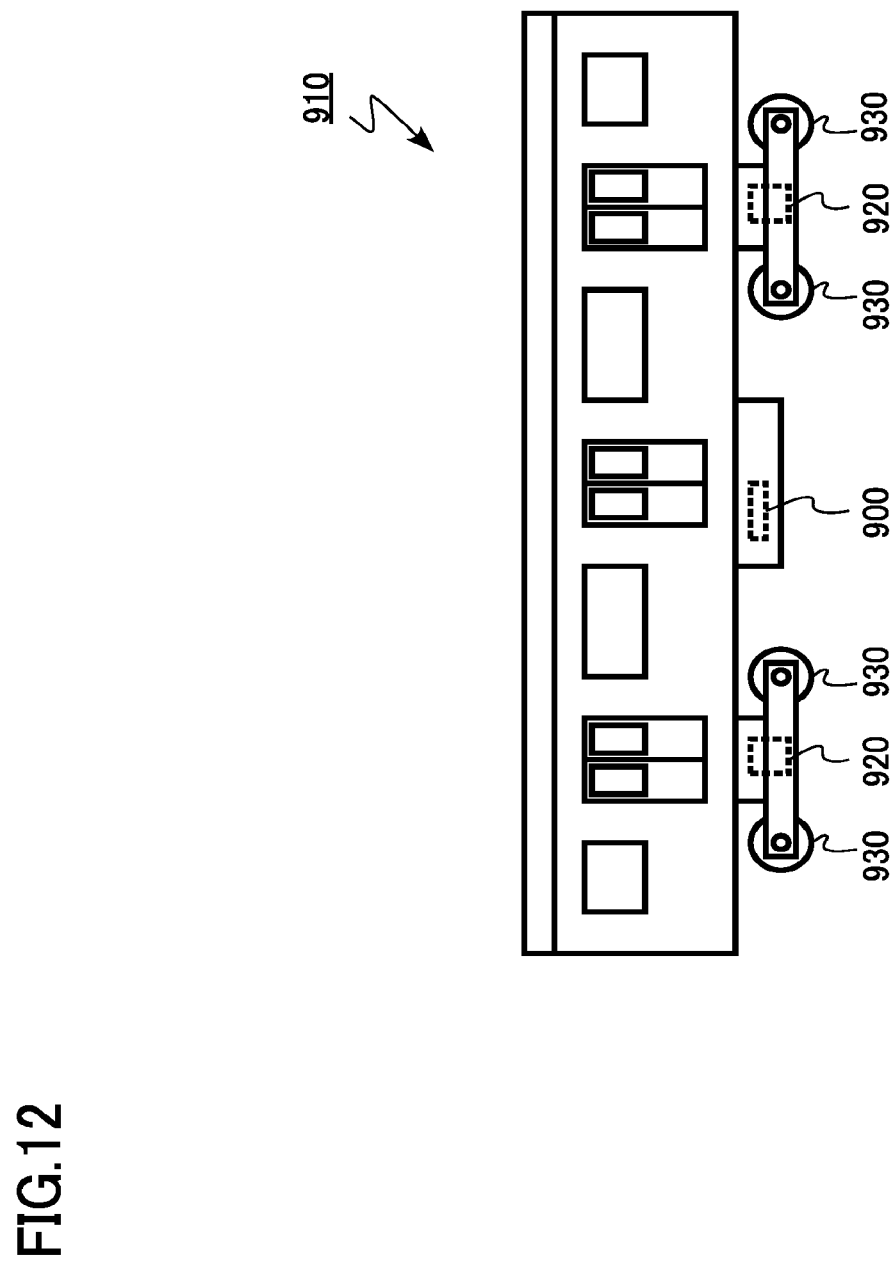
FIG. 12 is a schematic diagram of a vehicle according to a seventh embodiment.

FIG. 12 is a schematic diagram of a railroad vehicle 910 according to the present embodiment. The railroad vehicle 910 includes the motors 920 and the power conversion system 900.

The motors 920 are driven by an AC voltage output from the power conversion system 900. Wheels 930 are rotated by the motors 920.

According to the present embodiment, there is provided the railroad vehicle 910 including a semiconductor device capable of achieving both high-speed operation and restriction in voltage variation.

Eighth Embodiment

A vehicle according to the present embodiment is an automobile including a semiconductor device according to the first to fourth embodiments.

Figure 13:
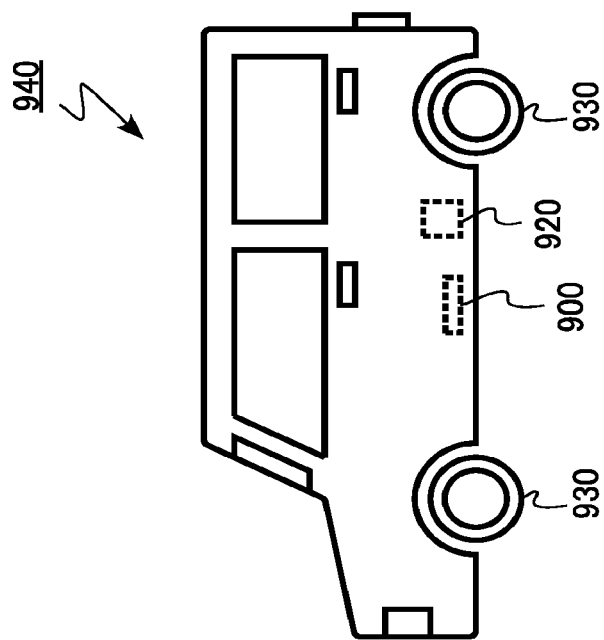
FIG. 13 is a schematic diagram of a vehicle according to an eighth embodiment.

FIG. 13 is a schematic diagram of an automobile 940 according to the present embodiment. The automobile 940 includes the motor 920 and the power conversion system 900.

The motor 920 is driven by an AC voltage output from the power conversion system 900. The wheels 930 are rotated by the motor 920.

According to the present embodiment, there is provided the automobile 940 including a semiconductor device capable of achieving both high-speed operation and restriction in voltage variation.

Ninth Embodiment

An elevator according to the present embodiment includes a semiconductor device according to the first to fourth embodiments.

Figure 14:
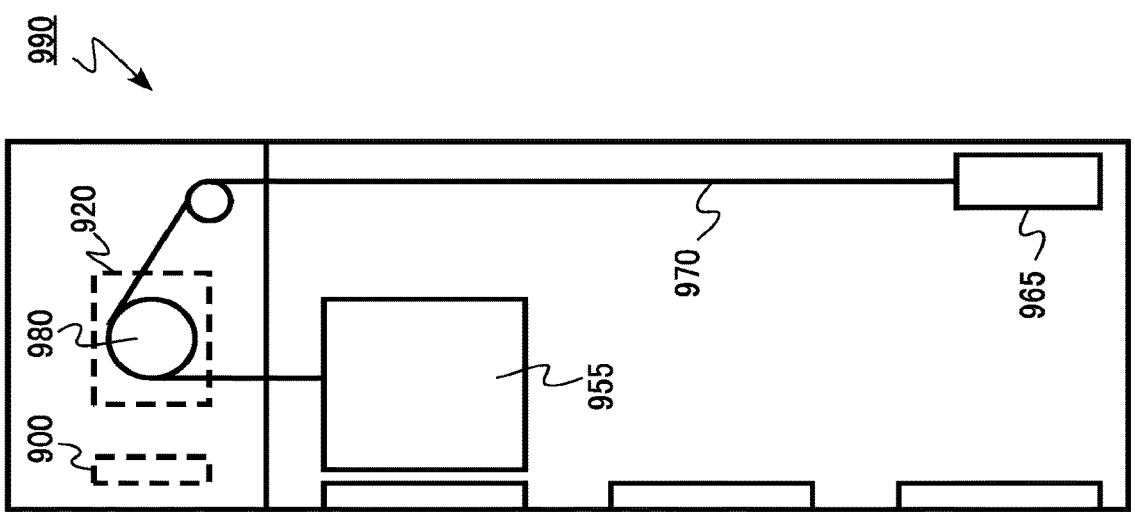
FIG. 14 is a schematic diagram of an elevator according to a ninth embodiment.

FIG. 14 is a schematic diagram of an elevator according to the present embodiment. An elevator 990 according to the present embodiment includes a cage 955, a counterweight 965, a wire rope 970, a winder 980, the motor 920, and the power conversion system 900.

The motor 920 is driven by an AC voltage output from the power conversion system 900. The winder 980 is rotated by the motor 920 to move up or down the cage 955.

According to the present embodiment, there is provided the elevator 990 including a semiconductor device capable of achieving both high-speed operation and restriction in voltage variation.

With a semiconductor device according to at least one embodiment described above, it is possible to provide a semiconductor device capable of high-speed operation, which includes a first transistor having a first electrode, a second electrode, and a first control electrode, the first transistor performing a switching operation; a second transistor having a third electrode electrically connected to the second electrode, a fourth electrode, and a second control electrode, the second transistor performing an analog operation; and a third transistor having a fifth electrode electrically connected to the fourth electrode, a sixth electrode, and a third control electrode.

While certain embodiments have been described, these embodiments have been presented by way of example only, and are not intended to limit the scope of the inventions. Indeed, the semiconductor device and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first transistor having a first electrode, a second electrode, and a first control electrode, the first transistor performing a switching operation;
   a second transistor having a third electrode electrically connected to the second electrode, a fourth electrode, and a second control electrode, the second transistor configured to receive a voltage at the second control electrode to perform an analog operation;
   an AC signal source electrically connected to the first control electrode;
   a variable power supply electrically connected to the second control electrode; and
   a third transistor having a fifth electrode electrically connected to the fourth electrode, a sixth electrode, and a third control electrode.

2. The semiconductor device according to claim 1, further comprising:
   a controller configured to control the voltage at the second control electrode between a first voltage value and a second voltage value that is more than the first voltage value and is equal to or less than a voltage at the first control electrode.

3. The semiconductor device according to claim 1, further comprising:
   a capacitor electrically connected between the first electrode and the second control electrode.

4. The semiconductor device according to claim 1, further comprising:
   a fourth transistor having a seventh electrode electrically connected to the first electrode, an eighth electrode electrically connected to the fifth electrode, and a fourth control electrode.

5. The semiconductor device according to claim 1, wherein the semiconductor device is electrically connected to a fifth transistor having a ninth electrode, a tenth electrode, and a fifth control electrode electrically connected to the fifth electrode.

6. The semiconductor device according to claim 5, wherein the voltage at the second control electrode is based on a current flowing between the ninth electrode and the tenth electrode or a voltage difference between the ninth electrode and the tenth electrode.

7. A semiconductor device comprising the semiconductor devices according to claim 5, wherein the tenth electrode of one semiconductor device is connected to the ninth electrode of the other semiconductor device.

8. The semiconductor device according to claim 1, further comprising:
   a fourth transistor having a seventh electrode electrically connected to the first electrode, an eighth electrode electrically connected to the fifth electrode, and a fourth control electrode;
   a controller; and
   a fifth transistor having a ninth electrode, a tenth electrode, and a fifth control electrode electrically connected to the fifth electrode,
   wherein the controller turns ON the fourth transistor within a first predetermined time after a voltage at the fifth control electrode starts decreasing.

9. The semiconductor device according to claim 1, further comprising:
   a fourth transistor having a seventh electrode electrically connected to the first electrode, an eighth electrode electrically connected to the fifth electrode, and a fourth control electrode;
   a controller; and
   a fifth transistor having a ninth electrode, a tenth electrode, and a fifth control electrode electrically connected to the fifth electrode,
   wherein the controller turns ON the fourth transistor within a second predetermined time after a voltage at the tenth electrode starts increasing.

10. The semiconductor device according to claim 1, further comprising:
    a fourth transistor having a seventh electrode electrically connected to the first electrode, an eighth electrode electrically connected to the fifth electrode, and a fourth control electrode;
    a controller; and
    a fifth transistor having a ninth electrode, a tenth electrode, and a fifth control electrode electrically connected to the fifth electrode, wherein the controller turns ON the fourth transistor when a voltage at the fifth control electrode is at zero.

11. The semiconductor device according to claim 1, wherein the AC signal source receives a signal generated by a microcomputer or FPGA.

12. The semiconductor device according to claim 1, wherein the semiconductor device is mounted on a single package.

13. A power conversion apparatus comprising the semiconductor device according to claim 1.

14. A vehicle comprising the semiconductor device according to claim 1.

15. The semiconductor device according to claim 1, further comprising:
  a controller configured to control a voltage at the second control electrode equal to a high-level voltage or less of the first control electrode.

* * * * *